United States Patent
Hsu

(10) Patent No.: US 7,561,462 B2
(45) Date of Patent: Jul. 14, 2009

(54) CIRCUIT AND METHOD FOR A HIGH SPEED DYNAMIC RAM

(75) Inventor: Kuoyuan (Peter) Hsu, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 11/807,520

(22) Filed: May 29, 2007

(65) Prior Publication Data

US 2008/0117698 A1    May 22, 2008

Related U.S. Application Data

(60) Provisional application No. 60/859,367, filed on Nov. 16, 2006.

(51) Int. Cl.
*G11C 11/24* (2006.01)

(52) U.S. Cl. ............ 365/149; 365/189.15; 365/189.16; 365/203; 365/205

(58) Field of Classification Search .................. 365/149, 365/189.15, 189.16, 203, 205
See application file for complete search history.

(56) References Cited

U.S. PATENT DOCUMENTS

| 6,172,918 B1 * | 1/2001 | Hidaka .................. 365/189.11 |
| 6,798,687 B2 * | 9/2004 | Hsu et al. .................... 365/149 |

* cited by examiner

*Primary Examiner*—Hoai V Ho
(74) *Attorney, Agent, or Firm*—Slater & Matsil, L.L.P.

(57) ABSTRACT

An architecture, circuit and method for providing a high speed operation DRAM memory with reduced cell disturb. A DRAM global bit line select circuit couples a pair of local bit lines and the associated sense amplifier to the global bit lines using a circuit optimized for high speed operation. The select circuit and method also reduces or eliminates the bit line disturb effect of the prior art. The circuit and architecture of the DRAM incorporating the select circuit is particularly useful for embedding DRAM memory with other logic in an integrated circuit. For a read operation the select circuit discharges the appropriate global bit line directly to ground thus speeding the read cycles. For a write operation, a dedicated control line is used to couple write data to from the global bit lines to the selected local bit lines. Methods for operating the DRAM and the select circuits are disclosed.

21 Claims, 11 Drawing Sheets

CIRCUIT AND METHOD FOR A HIGH SPEED DYNAMIC RAM

This application claims the benefit of U.S. Provisional Application No. 60/859,367, filed on Nov. 16, 2006, entitled "High Speed DRAM Architecture," which application is hereby incorporated herein by reference.

TECHNICAL FIELD

The present invention relates to a circuit and method for providing circuitry to increase the speed of operation of a dynamic RAM ("DRAM") memory with enhanced performance. This circuitry is particularly useful when the DRAM is implemented as an embedded DRAM in an integrated circuit including other functions such as user specified logic, processor, interface functions, other memory types, and the like.

BACKGROUND

Highly integrated semiconductor circuits are increasingly important, particularly in the field of producing battery operated devices such as cell phones, portable computers such as laptops, notebook and PDAs, wireless email terminals, MP3 audio and video players, portable wireless web browsers and the like, and these integrated circuits increasingly include on-board data storage. As is known in the art, such storage may take the form of dynamic memory in which arrays of storage cells are provided, each cell is a storage capacitor formed with an adjacent access transistor. Dynamic memory ("DRAM") offers excellent circuit density and is often provided as fast access memory for a processor, such as a first level cache memory or scratchpad memory. In the prior art it is known to produce these DRAMs as stand alone integrated circuits using dedicated semiconductor process techniques that are specifically optimized to produce space and power efficient DRAM devices.

As semiconductor process technology advances have occurred, process fabrication technology has enabled the DRAM to be incorporated into large, highly integrated ICs, sometimes called "SOCs" or "systems on a chip." Typical applications for these embedded DRAMs or "e-DRAM" include for use as fast memory adjacent a processor such as cache memory, as fast scratchpad memory, or to reduce or eliminate the need for discrete DRAM devices. Portable devices are particularly important applications of highly integrated ICs, or SOCs. These devices include cell phones, pocket PCs, PDAs and the like.

FIG. 1 depicts a typical prior art memory cell 11. For a dynamic memory cell such as is commonly used, an access transistor (Ts) couples a data line (DL), sometimes referred to as a bit line or "BL", in response to a control voltage on a gate terminal of the access transistor, to a storage capacitor (Cs) which is coupled between the access transistor and a voltage (Vs). The voltage used as the potential for the storage capacitor can be a ground or a positive voltage, depending on the particular design of the DRAM as is known in the art. The gate of the access transistor Ts is coupled to one of a plurality of lines called word lines (WL), often referred to as "row lines" or "rows." These lines are conventionally routed across the DRAM array in row or column fashion and referred to as row lines. A typical DRAM will have many thousands of the memory cells 11 depicted. The cells will be arranged in one or more arrays and typically the bit lines or data lines DL will be arranged in a plurality of spaced columns, typically but not always perpendicular to the word lines or row lines arranged in a plurality of rows.

The storage capacitor may be fabricated in many ways. In the prior art planar capacitors have been used, more recently crown shaped capacitors formed above the access transistors in insulating and metal layers have been used to further increase the density (number of bits per unit of silicon area) of the arrays. Alternate implementations where the capacitors are formed as a trench formed into the substrate adjacent the access transistors are known in the art and are likewise used to increase capacity per silicon area.

The storage capacitor Cs of FIG. 11 may be used to hold a charge representing a logical data value. The voltage that corresponds to the charge stored may be assigned a logical '1' or a logical '0' depending on the design approach used for the particular DRAM. The voltage at cell node CN corresponds to the voltage across the storage capacitor. The storage capacitor is written by a control circuit coupling a data value for storage onto the bit line BL while the access transistor for the particular cell is simultaneously activated by placing the appropriate voltage on the control gate of the access transistor Ts, that is the word line WL associated with the memory cell 11 has a control voltage on it. To read the value, the access transistor is activated while no voltage or a simple bias level is placed on the bit line BL and the capacitor discharges through the access transistor to place a stored voltage on the bit line, which is then coupled to a sense amplifier (not visible) where the level is sensed and amplified to the appropriate voltage representing a logical value, this voltage is then coupled through input/output (I/O) circuitry that is connected to the data line DL to make the read data available for use.

Because the storage capacitor Cs has an inherent leakage current, the memory cell 11 must be periodically refreshed by control circuitry. The refresh cycle may be controlled by an external processor; more often in current memory products an on-board controller will periodically refresh the storage capacitors. The refresh is a read and write back access cycle that reads the stored values from a plurality of the memory cells which require refreshing (determined based on the time that has passed since the last refresh or access cycle), the stored data is read out, amplified by sense amplifiers, and written back into the cells. Because the storage cells of a one transistor or 1T cell such as memory cell 11 require refreshing to maintain a stored value, the memory implemented using such cells is referred to as "dynamic" memory. Dynamic memory requires more control circuitry than a static memory, such as an SRAM, but the small size of the DRAM cell allows many more bits of storage to be implemented per unit of silicon area than for a corresponding SRAM cell. Nonvolatile memory may also be used to store data, such as EEPROM, FLASH, and the like; these memories also require control circuitry and the cells are larger in area than the DRAM cell 11. These other memory types do not require refreshing and are often referred to as "non-volatile" memory cells. Importantly, a dynamic memory will lose the data in the absence of a power supply, while a non-volatile memory will retain the data. Static RAM cells are basically made up of transistor latches and therefore will retain the data so long as power is present but not in the absence of power. One method to make an SRAM, which has the advantage of a very rapid access time, act as a non-volatile memory is to use a battery backed up SRAM, so that the battery maintains power to the memory in the absence of system power. The DRAM has the best density and so is the preferred memory type for data storage of any substantial amount.

FIG. 2 depicts in a plan view a block diagram of a DRAM array of the prior art using many memory cells such as the one illustrated in FIG. 1. In DRAM 31, a plurality of memory cell arrays 35 is provided each having a plurality of memory cells 11 inside. The memory cells are arranged as rows and columns, with each column being associated with one bit of a data word, the I/O buffers 39 couple the data lines (not shown) which run in a columnar direction, to a data bus. Word line decoders 33 activate the word line associated with a row of the memory cells within the arrays 35 responsive to an address value. Each array of cells is coupled to a sense amplifier which receives two data lines, usually called bit line or BL and a complementary bit line or ZBL. In FIG. 2 a single memory bank is shown so only one pair of bit lines is coupled for each column. Control logic 41 provides the various signals to the sense amplifiers 37 and the I/O buffers 39 to cause the data presented at the I/O ports to be written to the appropriate row of memory cells, or, to cause stored data to be read from the appropriate row of memory cells to output data from the I/O buffers 39. All of these operations and the circuits required are well known in the art.

FIG. 3 depicts a plan view of a block diagram of a further prior art embodiment of a DRAM array which uses segmented bit lines or data lines to share the sense amplifiers between two banks of memory cells. In FIG. 3, DRAM array 51 includes a memory bank 0 which is an upper memory bank and has memory cell arrays 55 that include memory cells as shown in FIG. 1 arranged in rows and columns, each memory cell array 55 having a pair of bit lines or data lines BL and ZBL, word line decoders 53 provide the appropriate voltage on the appropriate word line or row lines (not shown) for reading and writing an addressed row of memory cells. Sense amplifiers 57 are shared between the upper memory bank 0 and the lower memory bank 1. A second word line decoder circuit 53 for bank 1 is depicted in the lower portion of the diagram and this word line decoder provides the required word line signals for addressing a row of memory cells in the memory arrays 59 of bank 1. The data lines or bit lines from bank 1 are also selectively coupled to the same sense amplifiers 57 for each column in an architecture known as "segmented" bit lines. Although only two memory banks are illustrated, many more may be provided. A complete DRAM of the prior art may include thousands or even millions of cells in a single device. I/O buffers 61 then provide output data to a data bus, or input data from a data bus, to couple the DRAM. The address lines are decoded to select the active row and the portion of the columnar bit line that is to be used for a particular cycle. Column address circuitry selects the correct column and segment based on the values of the address bits.

The arrangements of DRAM cells shown in FIG. 2 and FIG. 3 may depict the major blocks of a typical DRAM integrated circuit. However increasingly DRAM circuits are being embedded into application specific integrated circuits (ASICS), so called SOCs or "System on a chip" devices, custom integrated circuits and the like. FIG. 4 depicts, in one typical prior art arrangement, the major blocks of an ASIC IC1 with an embedded DRAM block A. In addition to the embedded DRAM, IC1 includes I/O buffers, an embedded SRAM block B which may be used as a register file, for example, a microprocessor core which could implement a programmable processor, a digital signal processor (DSP), or other known processors such as a RISC machine and the like. In addition to these core or predetermined functions, a section of user defined logic is shown. In this area a designer may implement functions that optimize the circuit for a specific use, such as for a PDA, digital camera, cell phone, music player, radio, or other application as is known in the art.

The use of improved semiconductor processing technology makes embedding DRAM and other memory blocks more and more attractive in current ASIC or semi-custom IC manufacture. Improved isolation and buried layer techniques, coupled with advanced photolithographic techniques, and asymmetric processing of different regions of the integrated circuit, make it possible to provide the smaller transistor sizes and capacitors required for the DRAM block in one portion of an integrated circuit, while processing a different portion of the integrated circuit to produce the larger transistors, and even analog components such as resistors, required for other applications, in a single piece of silicon. These advances make efficient and compact embedded DRAM arrays even more important.

FIG. 5 depicts a schematic of a typical prior art sense amplifier and a select circuit used with memory cell such as 11 shown in FIG. 1. In FIG. 5, a pre-charge/equalization circuit comprising transistors TN3, TN4 and TN5, and a control line BLEQ, is depicted. This circuit is controlled by the control signal BLEQ and when active, couples a voltage VBL (pre-charge/equalization voltage) to a pair of local bit lines labeled BL and ZBL through MOS transistors TN4 and TN5. In operation, the pre-charge circuit also acts as an equalization circuit, and couples these two nodes together through a pass gate TN3 to ensure the two local bit lines are equal.

The lines BL and ZBL (commonly referred to as "bit line" and "bit line bar", also commonly called digit lines or DL and DLZ) are coupled to the sense amplifier formed form transistors TB1, TN2, and TP1, TP2, which form a cross coupled latch. In operation the sense amplifier is enabled at a certain time in the memory cycle by applying the correct voltages to lines SP (sense P supply) and SN (sense N supply). These lines are shown extending across the columns formed by the bit lines BL and ZBL to indicate that these lines extend to other sense amplifiers associated with the other bit line pairs in the DRAM array (not visible in this drawing). Typically, the PMOS transistors TP1 and TP2, sometimes referred to as the "pull-up" transistors, are coupled to a positive voltage potential during sensing such as Vdd or Vcc, or sometimes a reduced positive supply such as Vdd/2, while in contrast the NMOS transistors, TN1 and TN2, often referred to as the "pull-down" transistors of the sense amplifier, are coupled to a ground or negative potential voltage during sensing, e.g. Vss level. When the sense amplifier is to sense data from the bit lines, a predetermined voltage is placed on both the P supply line SP and the N supply line SN and the latch formed from the cross coupled inverters (TP1, TN1 and TP2, TN2) within the sense amp senses the small voltage signal present on one of the local bit lines BL, and ZBL. This small voltage results from the discharge of a selected memory cell storage capacitor (selected by the associated word line, not visible in this drawing). The latch formed from the cross coupled inverters then latches the small signal received and amplifies it to a full logic voltage level, which can then be observed by the I/O buffers (not visible in this drawing) that are coupled to the global bit lines and at certain time periods, coupled to the local data lines through the operation of the bit line select circuit described below. The output of the sense amplifier is received on the local bit lines and appears as the bit lines BL and ZBL are spread apart in terms of voltage, one line will go low towards the low logical voltage level, and the other will rise from the initial equalization voltage to the high logical voltage level. It is important to note that only one of the local bit lines receives a voltage from a selected memory cell, the sense amplifier sees the difference between the read data (whether a positive small voltage or a negative small voltage) with respect to the other bit line, which remains at the equalization level, and amplifies that difference to spread the two lines apart.

Transistors TN6 and TN7 are pass gate transistors which couple the local bit lines BL and ZBL to the global bit lines GBL and ZGBL responsive to the bit line select control line SSL. In operation, the control line SSL is activated during a certain portion of the read, or write, cycle. In a read operation, the select control line SSL enables the transistors TN6 and TN7 such that the amplified voltage from the sense amplifier, now present on the local bit lines BL and ZBL, is coupled to the global bit lines GBL and ZGBL. In a write operation, the data from the I/O buffers coupled to the global bit lines GBL and ZGBL is further coupled onto the local bit lines BL and ZBL by the transistors TN6 and TN7, and when the word line for the active memory cell goes inactive, the write data is then stored into the selected memory cell storage capacitor.

In a prior art memory cell read operation, the voltage on the local bit lines must be sufficient to overcome any remaining voltage on the global bit lines when the SSL control couples the pairs of bit lines (local and global bit lines) together. Since the small voltage on the local bit lines from the storage capacitor in a memory cell is insufficient to overcome the external voltage, the timing of the signals operating the select circuit must be such that the select transistors TN6 and TN7 are not enabled by the select control line SSL until the sense amplifier has had sufficient time to sense the small signal voltage from the selected memory cell, and then to amplify the sensed voltage on the local bit lines BL and ZBL.

If a selected memory cell (selected by an active word or row line) is particularly weak, or, the timing of the read cycle is shortened too much, a cell "read disturb" effect error may occur. A memory cell read disturb means that the data stored in the cell may erroneously change value because the voltage appearing on the local bit lines erroneously is changed or "disturbed" by the external voltages being coupled from the global bit lines to the local bit lines. Since DRAM cells have a destructive read out characteristic, each read cycle, which discharges the storage capacitor of a selected cell onto a local bit line, is followed by a "write back" where the capacitor within the selected storage cell is charged again. This charge is provided from the amplified voltage now present on the local bit lines due to the operation of the sense amplifier. However, if during the select part of the read cycle the voltage on the local bit lines is erroneously modified or disturbed, the voltage written back to the storage cell may be incorrect. In that case, for the next read of the particular storage cell, an incorrect data value is retrieved. "Read disturb" or "cell disturb" is a problem well known in the DRAM art.

FIG. 6 is a timing diagram for a prior art DRAM memory cell read operation. In the prior art read operation, a read cycle begins when the word line for a selected memory cell becomes active. In FIG. 6, the word line WL is active when it is low, so the cycle begins when the word line falls below a threshold voltage and ends when it rises back through this voltage. In this example the cycle time is 3.3 nanoseconds, although this is only exemplary for purposes of this description and is not limiting.

In FIG. 6, after the line labeled "word line WL" falls, the local bit lines can be seen to begin to separate from an initial, equalized value. As the cell capacitor is discharged onto the local bit lines, one of the lines will fall below the equalized value and the other will rise above the equalized value. Following this initial time where the cell is accessed onto the local bit lines, the sense amplifier will be enabled. The sense amplifier will then latch this small signal differential voltage and amplify it to cause the local bit line to spread farther apart, which is the differential voltage between the two local bit lines will increase due to the amplification by the sense amplifier. This amplification is seen in FIG. 6, as the time tR begins, the lines labeled "local bit line pair" spread apart over time, to form full logic levels, one line going high, the other going low.

After a predetermined time elapses the select control signal, labeled SSL in FIG. 6, becomes active, in this example the line is an active "high" and rises to become active. As the select control line SSL passes through a threshold voltage for the transistors TN6 and TN7, the global bit lines are coupled to the local bit line pair. As can be seen in the timing diagram of FIG. 6, if the global bit lines, or one of them, have a voltage on that line prior to the read cycle, then a read disturb can occur when the local bit line and the global bit line are coupled together. If the sense amplifier has not had sufficient time to develop a strong voltage on the local bit line prior to the SSL active time, this can cause an erroneous operation as discussed above. In this example, it can be seen that a voltage "hump" appears on one of the local bit lines when the value is disturbed by the discharge of the global bit line onto the local bit line. This is shown in FIG. 6.

In prior art approaches to overcome this problem, read disturb errors are typically addressed or prevented by increasing the delay or waiting time before the select control signal is asserted, so that the local bit lines to have time to have a solid voltage developed before the select control line couples the global bit lines to the local bit lines. This approach essentially lengthens the DRAM read cycle, which slows the operation of the DRAM array and so makes higher speed DRAMs impractical to build. This approach recognizes that in the circuit of FIG. 5, the global bit line that is to receive a "low" voltage from one of the local bit lines has to be discharged through the sense amplifier transistor pull down circuit. Even so, some memory cells may have higher charge leakage than others, which results in a "weak" memory cell (the small signal voltage output during a read cycle is smaller) and those cells may still experience a "disturb". Since these effects may not be completely observable at the time of manufacture, read disturb errors continue to occur in DRAMs even after extensive testing and burn-in cycles are performed to try to eliminate weaker integrated circuits. Read cycle times are therefore extended to try to ensure proper operation of the devices in the field, resulting in slower than desired DRAM operation.

In a write operation, as is known in the prior art, the SSL control line is used to couple the write data present on the global bit lines to the selected local bit line pair, such as BL and ZBL in FIG. 5. During the write cycle, the local bit lines are charged to a full Vcc/Vdd level to make sure a full voltage is stored in the addressed storage cell, and waiting for the full rise time to Vdd of the local bit lines also extends the time of the write cycle in the prior art DRAMs. This write cycle time, which cannot start until the select control lines SSL couple the write data onto the local bit lines through the pass gates TN6 and TN7 in FIG. 5, further slows the operation of the prior art DRAM devices.

The read disturb problem, and the relatively long write and read cycle times of the prior art memory column select circuits, apply to prior art DRAMs, whether implemented as discrete memory integrated circuits, and also to those memory arrays implemented as e-DRAMs embedded in integrated devices. As increasing device integration continues in advanced integrated circuit design, the use of embedded DRAM becomes more prevalent, but stand alone commodity DRAM chips are also still important in the memory chip market. As semiconductor process technologies continue to advance to smaller and smaller minimum feature sizes, the demand for faster DRAM also increases as the switching speed of the logic transistors increases; that is, as processor speeds increase the memory speeds also need to increase to keep up with the processors. In order for the DRAM or e-DRAM to keep up with the processor or circuitry speed in the system, the DRAM cycle times must be shortened.

A need thus exists for improved DRAM circuitry and methods that substantially maintain the layout efficiency and compactness of the prior art approaches while offering an efficient solution to the read disturb problem on the bit lines, while still maintaining proper noise margins and ensuring correct data retention, providing increasingly fast DRAM access times, efficient operation, and efficient use of silicon area for both embedded and discrete DRAM circuits.

SUMMARY OF THE INVENTION

These and other problems are generally solved or circumvented, and technical advantages are generally achieved, by embodiments of the present invention, which provide circuits and methods of forming an improved select circuit and sense amplifier for a DRAM for use in an integrated circuit. The improved circuit and methods solve the read disturb problems associated with coupling global bit lines to local bit lines, while providing faster operation for both read and write cycles when compared to the DRAMs of the prior art.

In one preferred embodiment, the bit line select circuit in a DRAM includes a pair of coupling transistors which couple the global bit lines to a selected pair of local bit lines during a read cycle. Another pair of coupling transistors are used to couple write data from the global bit lines to a selected local bit line pair for write cycles. The use of a separate read and write select line enables improvement in cycle time, because read cycle and write cycle timing can be optimized independently from one another.

In one preferred method embodiment, local bit line pairs in a DRAM array are coupled to global bit line pairs with one timing during a read cycle, and with a different timing during a write cycle, to optimize the timing and thereby reduce the cycle time and increase the speed of the DRAM memory operations.

In another preferred embodiment, an embedded DRAM is provided as a portion of an integrated circuit that also includes logic circuitry and optionally other functions, such as non-volatile memory, digital signal processors, analog to digital converters, SRAMs, and the like. The embedded DRAM achieves a high access speed by use of select circuits for coupling local bit line pairs to global bit lines that incorporate the independent read select and write select circuits and the resulting reduced cycle times of the invention.

In another preferred embodiment, a DRAM integrated circuit is provided that has a plurality of memory arrays of dynamic memory cells, each arranged in columns and rows, and each having local bit line pairs coupled to global bit lines by bit line select circuits incorporating features of the invention including independent read and write select transistors and improved cycle timing. The preferred embodiment DRAM integrated circuit has a higher speed of operation due to the advantageous use of the invention.

A method of operating a DRAM is provided wherein the coupling of the local bit lines to the global bit lines for read and write cycles is optimized by providing separate read and write select circuitry and control lines. The read cycle includes coupling the global bit line that will be pulled low to a ground discharge path to rapidly discharge any existing voltage. The write cycle includes coupling the global bit lines, including the data to be written to the local bit lines, to the local bit lines very early in the write cycle, thereby shortening the time required to get the local bit lines to a full logical one and logical zero level for the cell write cycle. By shortening the cycle time for both reads and writes over the prior art methods, the methods of the invention provide a high speed DRAM operation.

Integrated circuits incorporating the DRAM of the invention may embed the DRAM including the novel select circuits with various other functions including processors, additional embedded SRAM blocks, I/O circuitry, clocking circuitry, DAC/ADC converters, and the like, to form large systems on a chip (SOCs) as is known in the art.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 7:
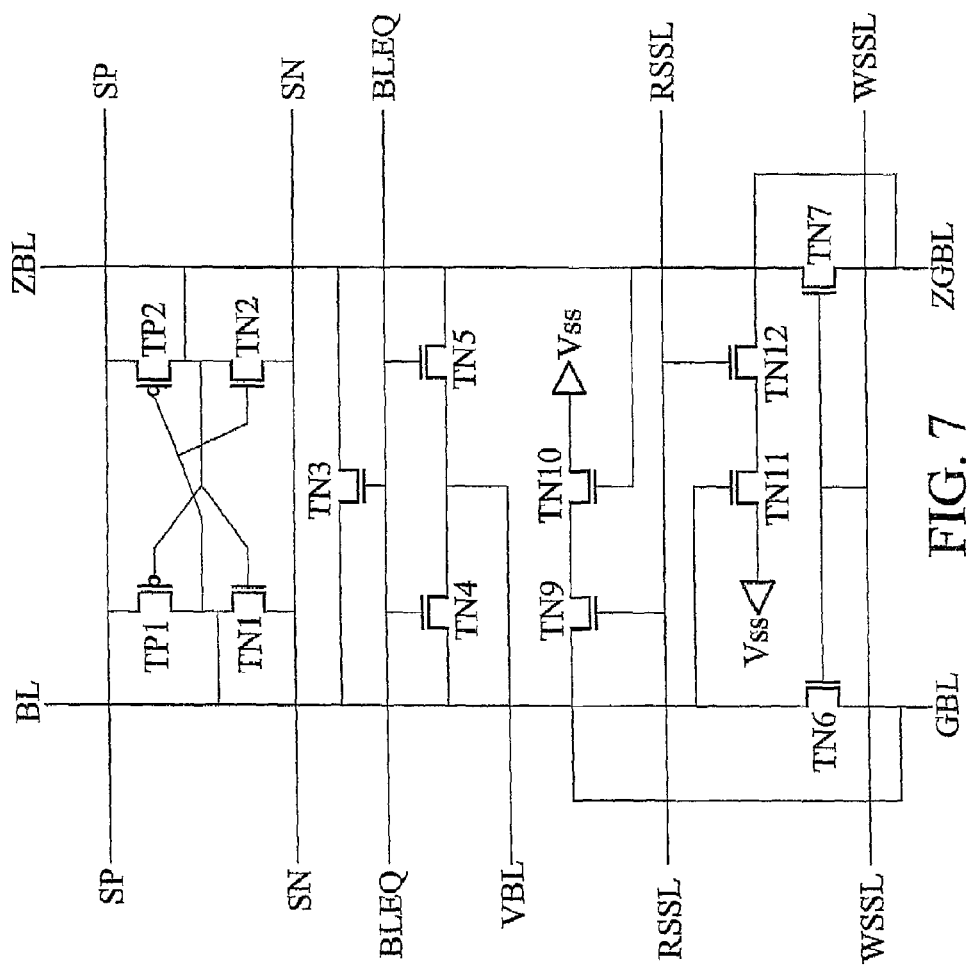
FIG. 7 illustrates a schematic view of a first preferred embodiment of the bit line select circuit of the invention.

FIG. 7 depicts in a simple schematic view a preferred circuit embodiment of the sense amplifier and bit line select circuit incorporating the invention. In FIG. 7, transistors TN3, TN4 and TN5 and control line BLEQ provide pre-charging and equalization functions, responsive to signal BLEQ, as in the schematic of FIG. 5. Transistors TP1, TP2, TN1, TN2 form a sense amplifier as in FIG. 5. The read select circuit of transistors TN9, TN10, TN11, TN12 and the read select control signal RSSL, and the write select circuit of transistors TN6, TN7 and the control signal WSSL, provide in a first preferred embodiment, the features of the invention.

In a read operation for the circuit of FIG. 7, the read select control signal RSSL will become active following the beginning of the read cycle, which again starts when the word line WL (not visible in this schematic drawing) becomes active for a respective memory cell coupled to one of the local bit lines BL and ZBL. As the memory cell discharges its stored voltage from the storage capacitor, the sense latch will begin amplifying the differential voltage observed between the local bit lines. In contrast to the prior art, however, the read select control signal RSSL will become active much later after the sense amplifier becomes active. This is possible because the transistors of the improved select circuit provide a path to discharge the low-going global bit line to ground, thereby avoiding the read disturb problem of the prior art. As the control signal RSSL becomes active, transistors TN12 and TN9 in FIG. 7 couple the global bit lines to the transistors TN10 and TN11. Each of these transistors provides a discharge path to ground for one of the global bit lines. As the local bit lines are complementary, the opposite side local bit line will be a high voltage when the read causes the global bit line to be a low voltage. Thus, transistor TN10 is coupled to the ZBL local bit line, and when that line is a "high" voltage, the global bit line GBL will be discharged to a "low" voltage. Corresponding transistor TN11 is coupled to the local bit line BL, and when that line is a "high voltage" during a read cycle, the transistor TN11 will provide a discharge path with transistor TN12 to pull the global bit line ZGBL to a low voltage. In this manner, the read disturb problem is eliminated and the read select line RSSL may become active much later in the read cycle, that is, the cycle time may be shortened, thereby speeding up the operation of the DRAM for read cycles.

For a write operation, the transistors TN6 and TN7 are activated by the write control line WSSL and thereby couple the write data present on the global bit lines GBL and ZGBL to the local bit lines BL and ZBL. Because the read select control lines and the write select control lines are separated in this embodiment, unlike the prior art select circuits, the timing of the write cycle can be quite different from the timing of the read cycle. The write select lines WSSL can become active for a particular column in the array to be written much earlier in the cycle, that is, the write cycle can also be shortened as compared to the write cycle of the prior art, thus the operation of the DRAM incorporating the invention can be made faster without any problems.

Figure 6:
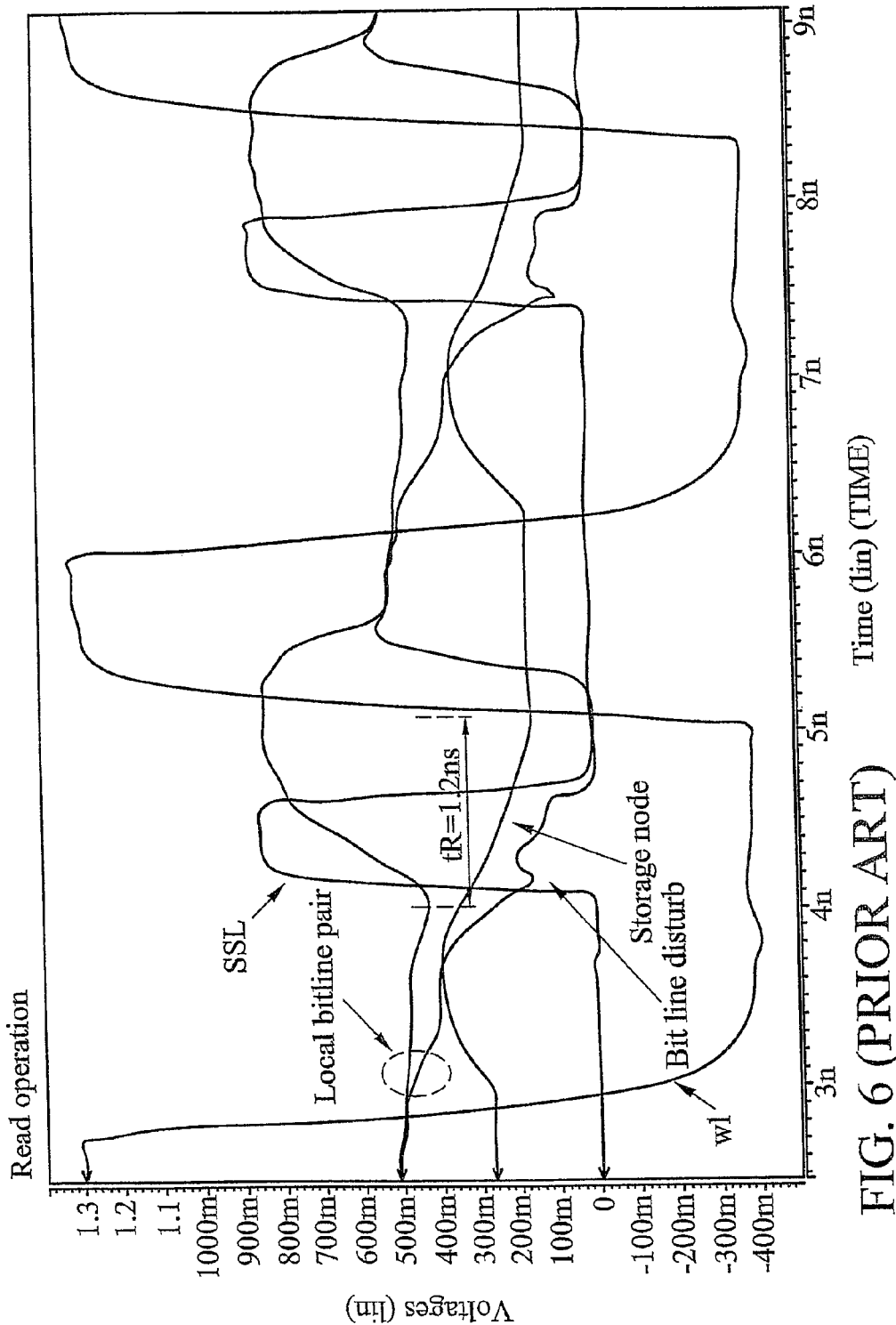
FIG. 6 illustrates a timing diagram for a read operation of the prior art select circuit.
Figure 8:
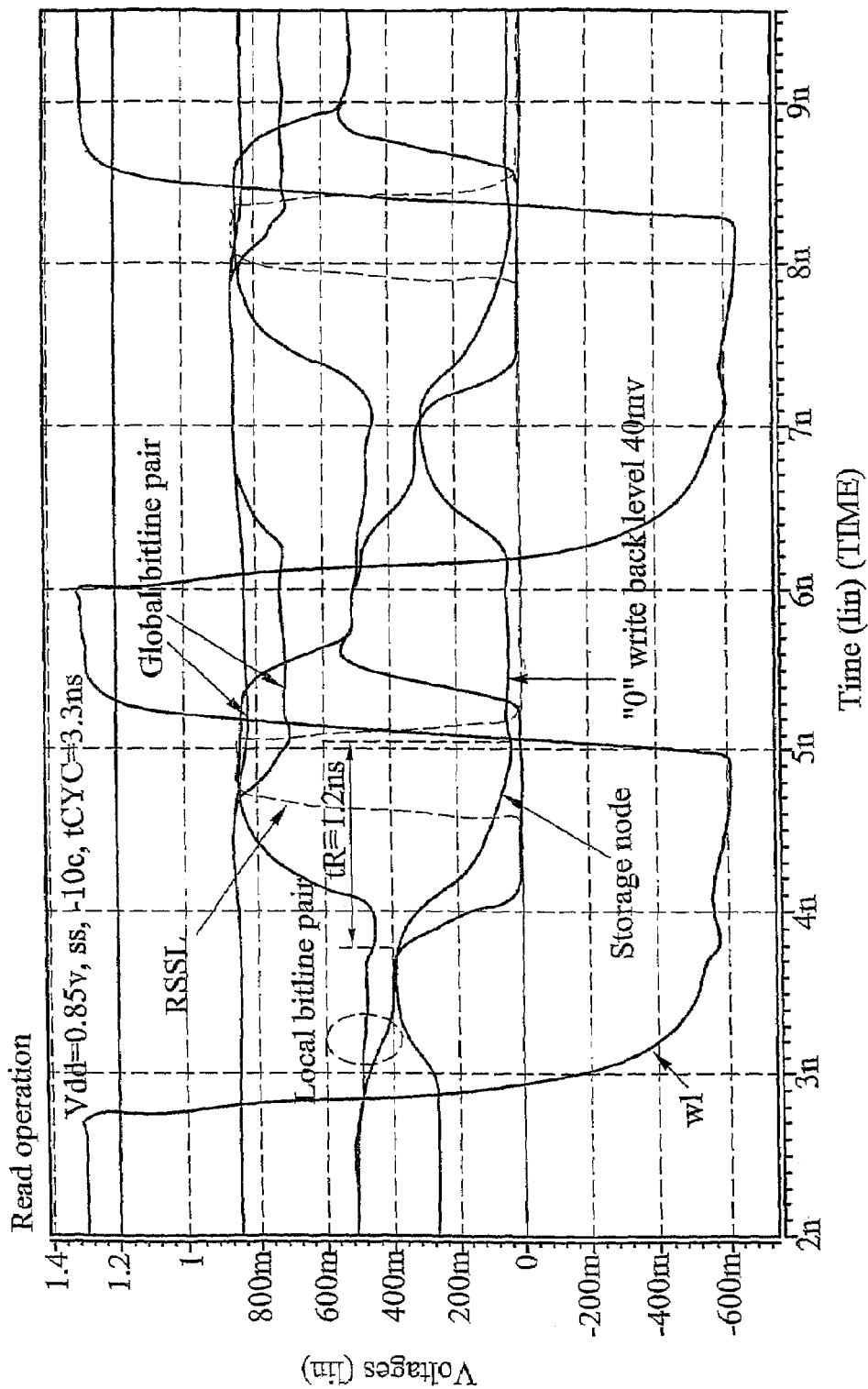
FIG. 8 depicts a timing diagram illustrating a read cycle of a DRAM incorporating the preferred embodiment of FIG. 7.

FIG. 8 illustrates a timing diagram showing the methods of the preferred bit line select circuit embodiment as applied to a DRAM read operation. In FIG. 8, again a read cycle of 3.3 nanoseconds (tcyc-3.3 ns) is depicted. As the word line WL falls through its active threshold, a selected memory storage cell discharges onto one of the local bit lines BL or ZBL and causes the small differential voltage to separate the local bit line pair. The read cycle begins as the sense amplifier is enabled and the sense latch transistors amplify this differential voltage to logical levels, as seen in FIG. 8 the local bit line pair begins spreading apart. However, in this preferred method the read select line RSSL is not made active for some time yet, in contrast to the prior art SSL line as illustrated in FIG. 6. This extra delay (approximately 0.5 nanoseconds of added delay in this example, although this timing is exemplary and not limiting) is made possible because the read select circuit of the preferred embodiment of FIG. 7, including the discharge transistors, will quickly discharge the respective global select line, accordingly the read select control line RSSL can become active later in the cycle, giving more time for the local bit lines to develop a full logic voltage before the read select line (RSSL) becomes active. The read disturb effect on the local bit lines, shown in the prior art timing diagram of FIG. 6, no longer occurs. As can be seen in FIG. 8, when using the preferred embodiment of FIG. 7 and delaying the RSSL control line, the local bit line transitions smoothly to a low voltage level without any read disturb effect.

Figure 9:
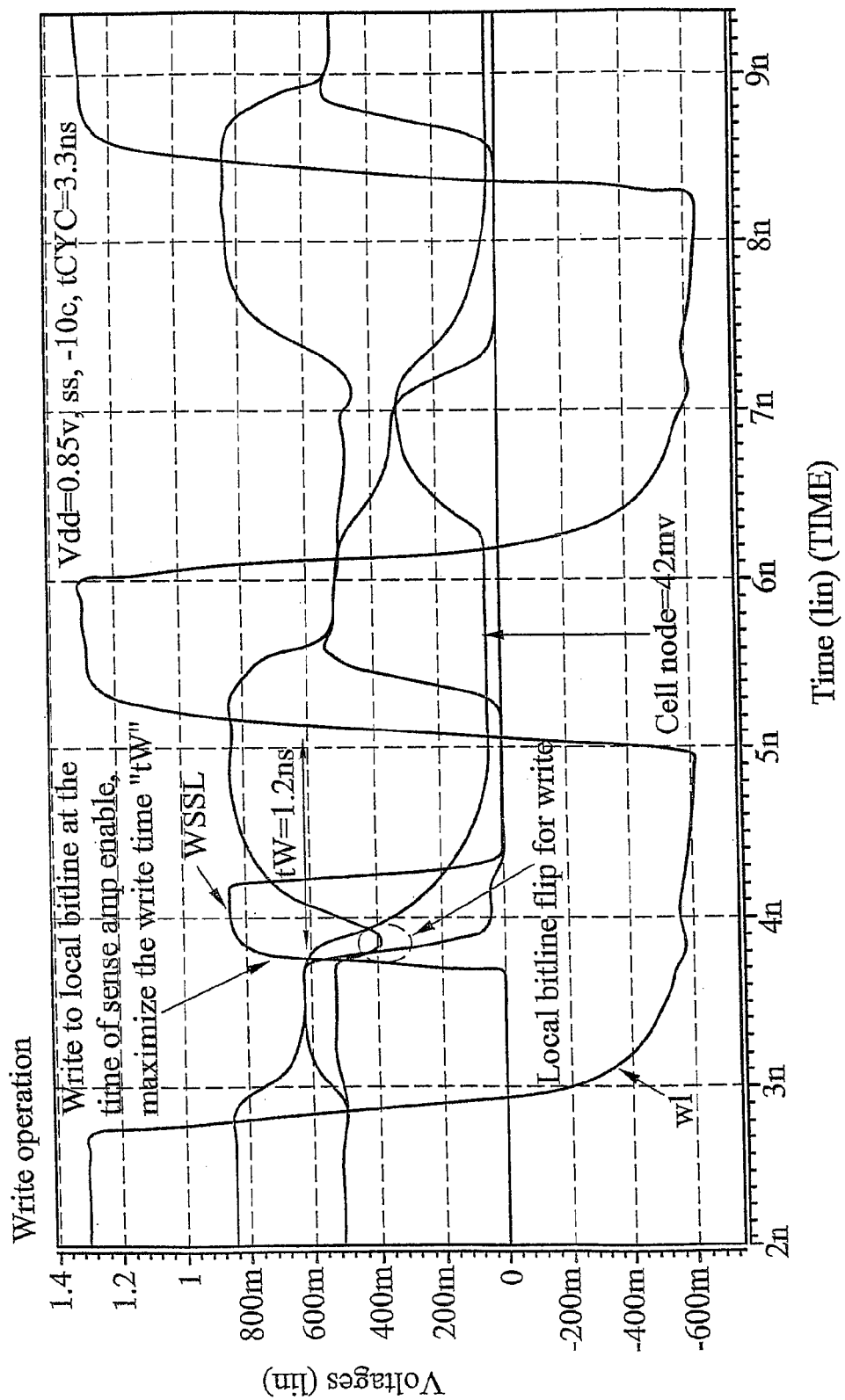
FIG. 9 depicts a timing diagram illustrating a write operation of a DRAM incorporating the preferred embodiment of FIG. 7.

FIG. 9 depicts a write operation timing diagram for a DRAM using a preferred method for operating the preferred embodiment bit line select circuit depicted in FIG. 7. In FIG. 9, the write cycle begins, as did the read cycle described above, when the word line WL becomes active and the selected memory cell begins discharging onto the local bit line, creating a differential voltage that spreads the local bit lines apart. As before, a predetermined time after the WL line falls (active low control signal), the sense amplifier is enabled and the local bit lines begin spreading apart. Using the separate write line circuit of the preferred embodiment of FIG. 7, the write select line (WSSL) can be made active as soon as the sense amplifier is enabled. The write data from the global bit lines GBL and ZBGL is passed onto the local bit lines; this can be seen in FIG. 9 as the local bit lines "flip" polarity as the write data is passed onto the local bit lines. Because the WSSL select control can be active much earlier than the prior art SSL line, the write time tW can be maximized, this enables the circuit to get the local bit lines BL, ZBL to the full logic voltage levels sooner in the write cycle, thus, the write cycle time can be shortened over the prior art DRAM write cycle.

Figure 1:
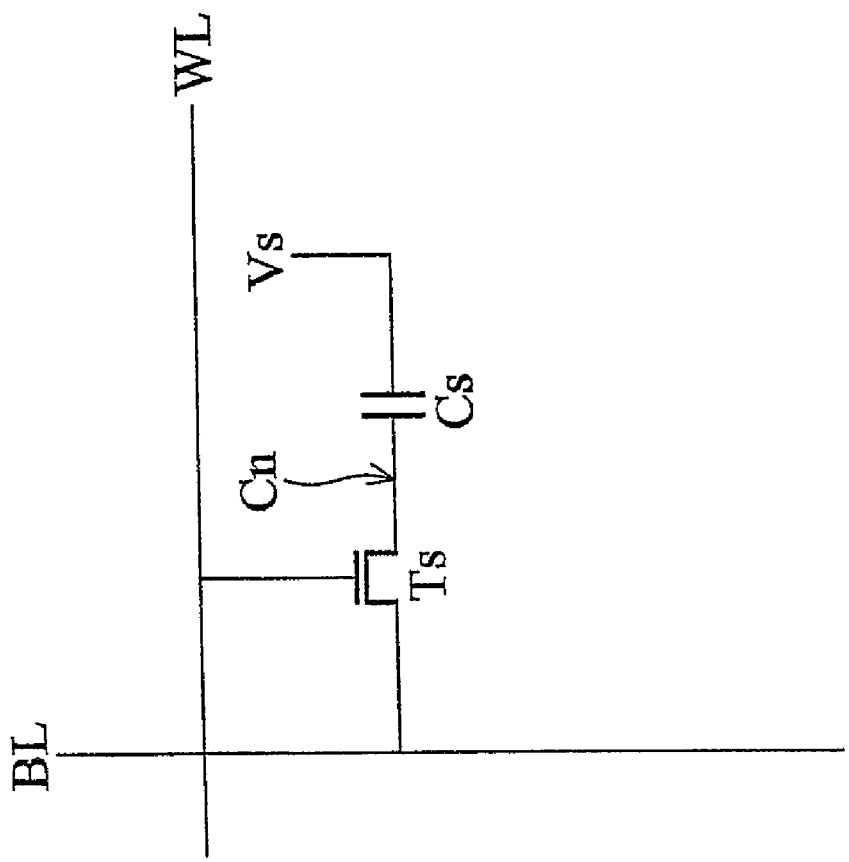
FIG. 1 illustrates a memory cell of the prior art.
Figure 2:
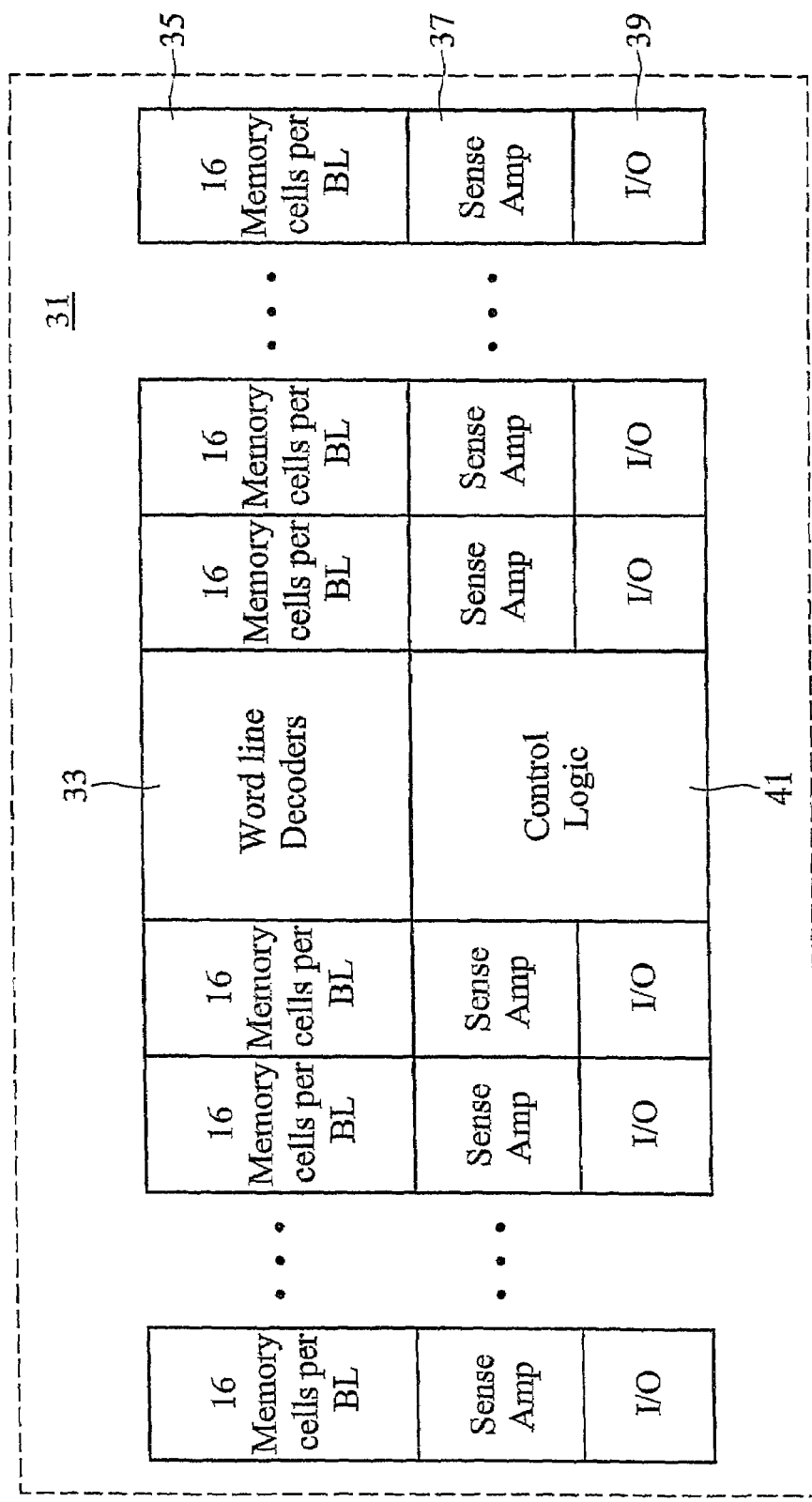
FIG. 2 illustrates a simplified block diagram of a portion of a DRAM cell array of the prior art.
Figure 3:
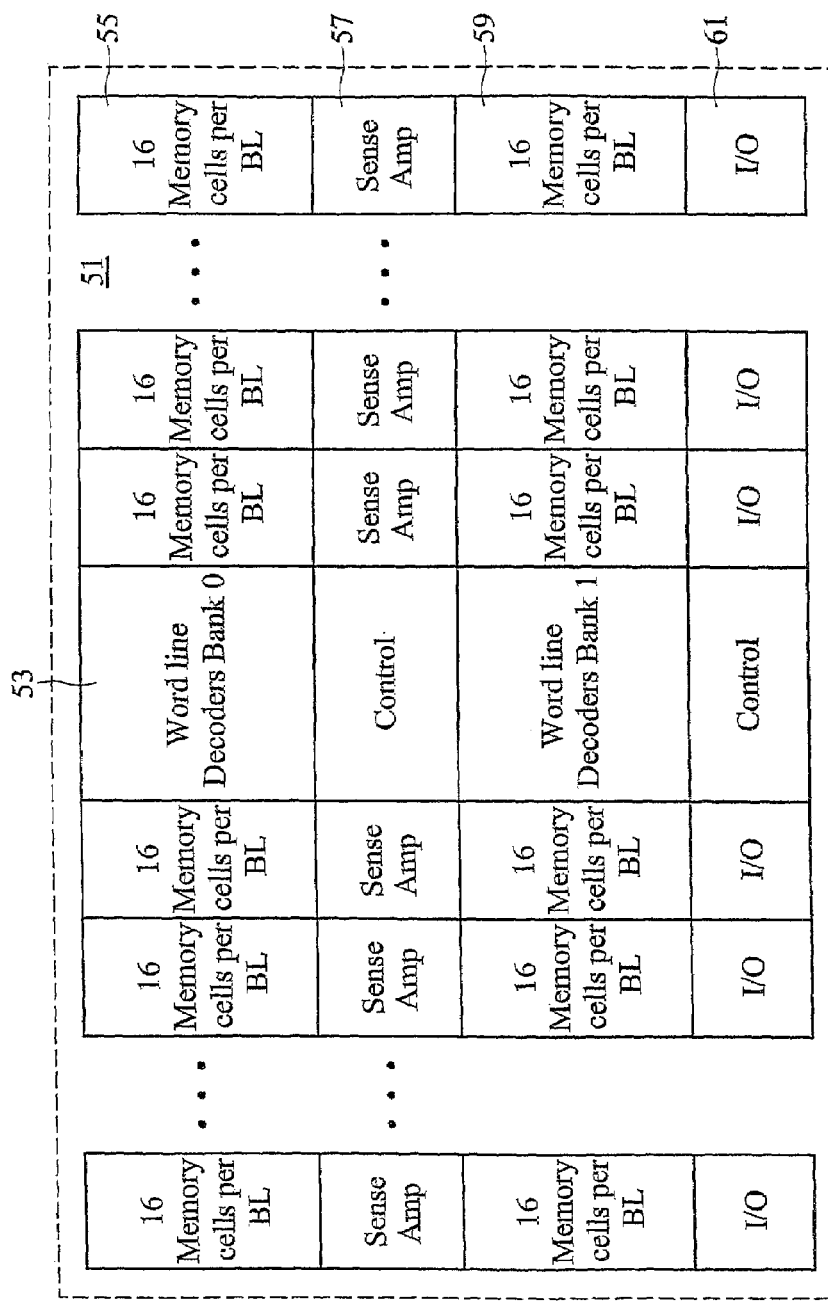
FIG. 3 illustrates in a simplified block diagram a portion of a two bank DRAM cell array of the prior art.
Figure 4:
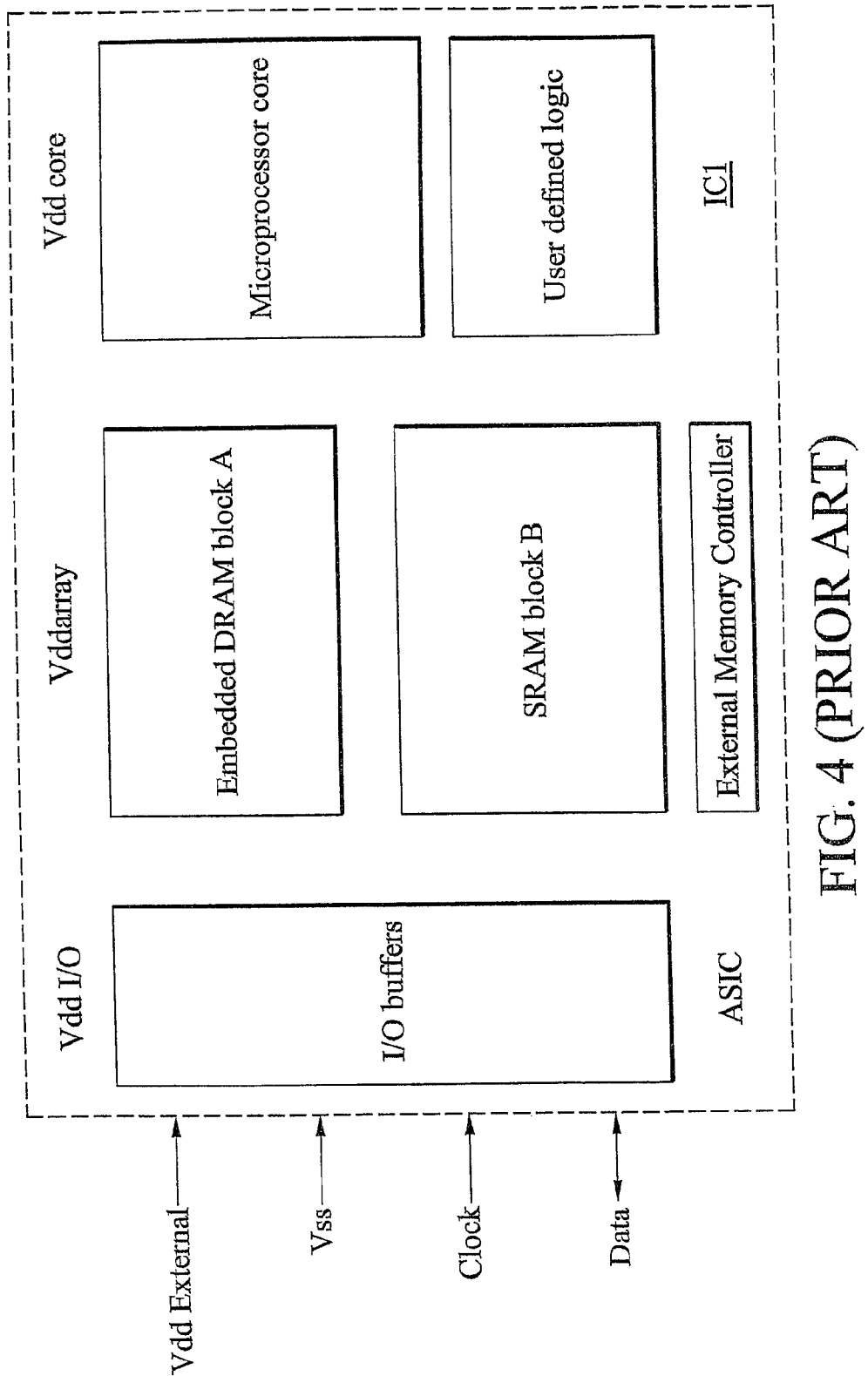
FIG. 4 illustrates in a simple plan view a block diagram of an integrated circuit incorporating an embedded DRAM array with other circuitry.
Figure 5:
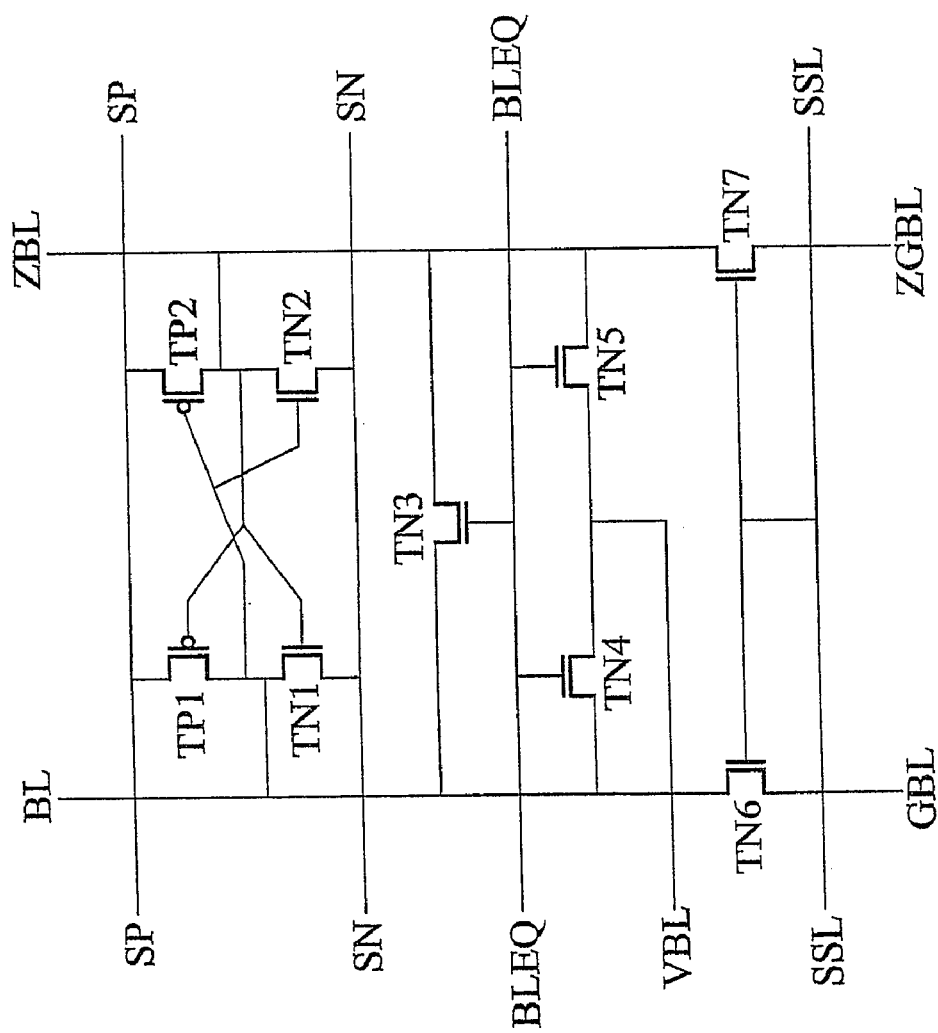
FIG. 5 illustrates a schematic view of a local bit line select circuit and sense amplifier as used in DRAM circuits of the prior art.
Figure 10:
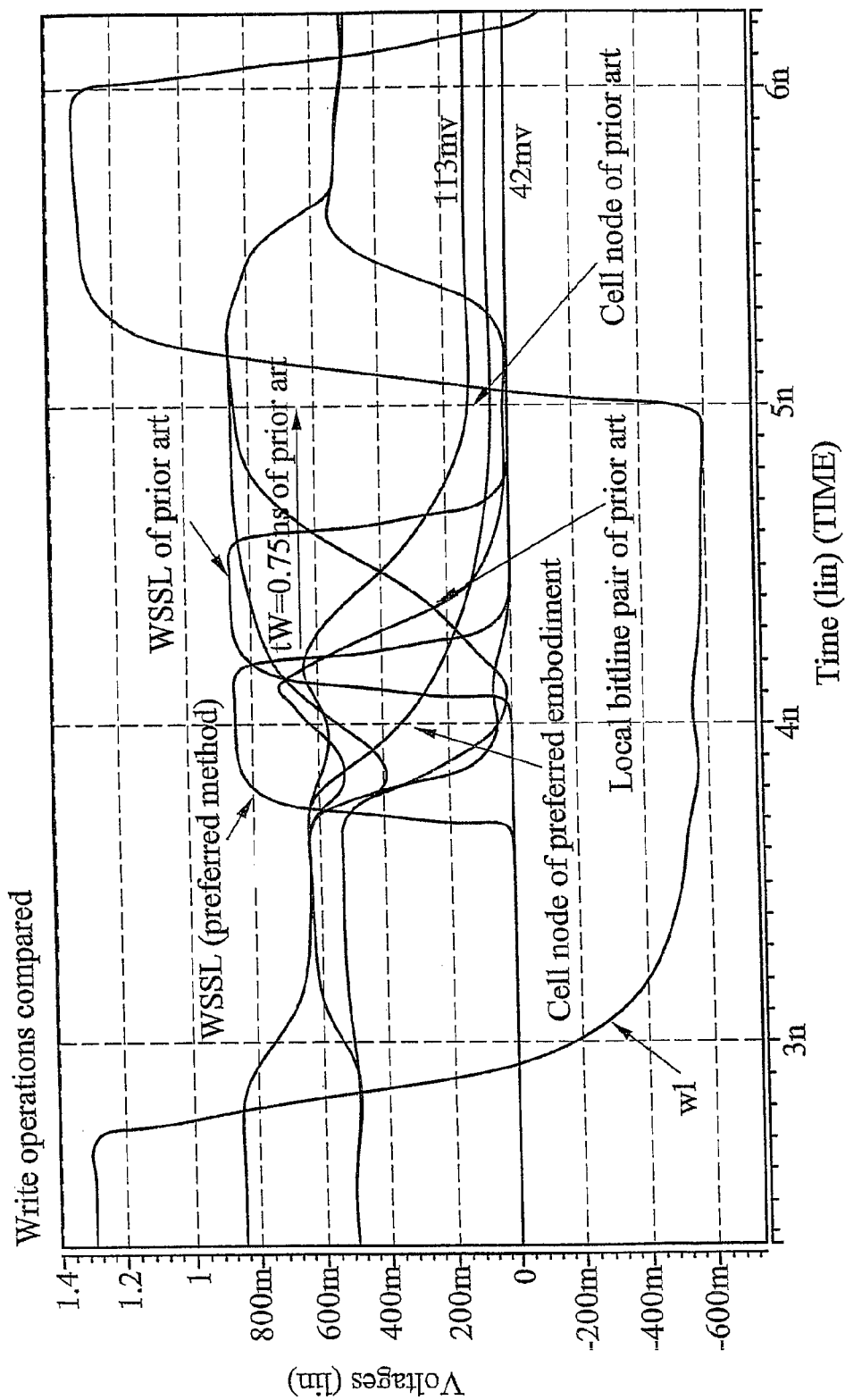
FIG. 10 depicts a timing diagram illustrating a comparison between the operation of a prior art DRAM in a write cycle and a DRAM write cycle of a preferred embodiment of the present invention.

FIG. 10 compares the write cycle of the preferred method to the operation of the prior art write cycle. In FIG. 10, again an exemplary memory cycle of 3.3 nanoseconds (tcyc=3.3 ns) is illustrated in a timing diagram. The word line labeled WL becomes active as an active low signal, falling to below a threshold to begin the cycle. The local bit line pair begins separating as the selected memory cell discharges onto one of the local bit lines. The write select line of the preferred method for operating the preferred embodiment of FIG. 7 is shown becoming active (rising as an active high control signal) immediately following the sense amplifier enable time; in contrast the write select line of the prior art becomes active much later in the cycle. The write time of the prior art circuit of FIG. 5 is depicted, in this example, as 0.75 nanoseconds, about 0.5 nanoseconds shorter than the write time achieved using the preferred method. The beneficial effect of the timing of the earlier write select control line is also seen in FIG. 10, the cell node for the low going bit line in the preferred embodiment approaches zero, at 42 millivolts, while for the prior art, the lowest level reached is 113 millivolts in this example. The lower the low voltage at the "write back" time, the more noise margin and stronger the signal sensed in a subsequent read of the memory cell will be. By gaining a longer write time tW using the select circuit of the preferred embodiment, the use of the invention improves the performance of the circuit and the DRAM; also the use of an earlier write select signal WSSL enables the write cycle to be shortened while maintaining noise margins and proper operation.

Figure 11:
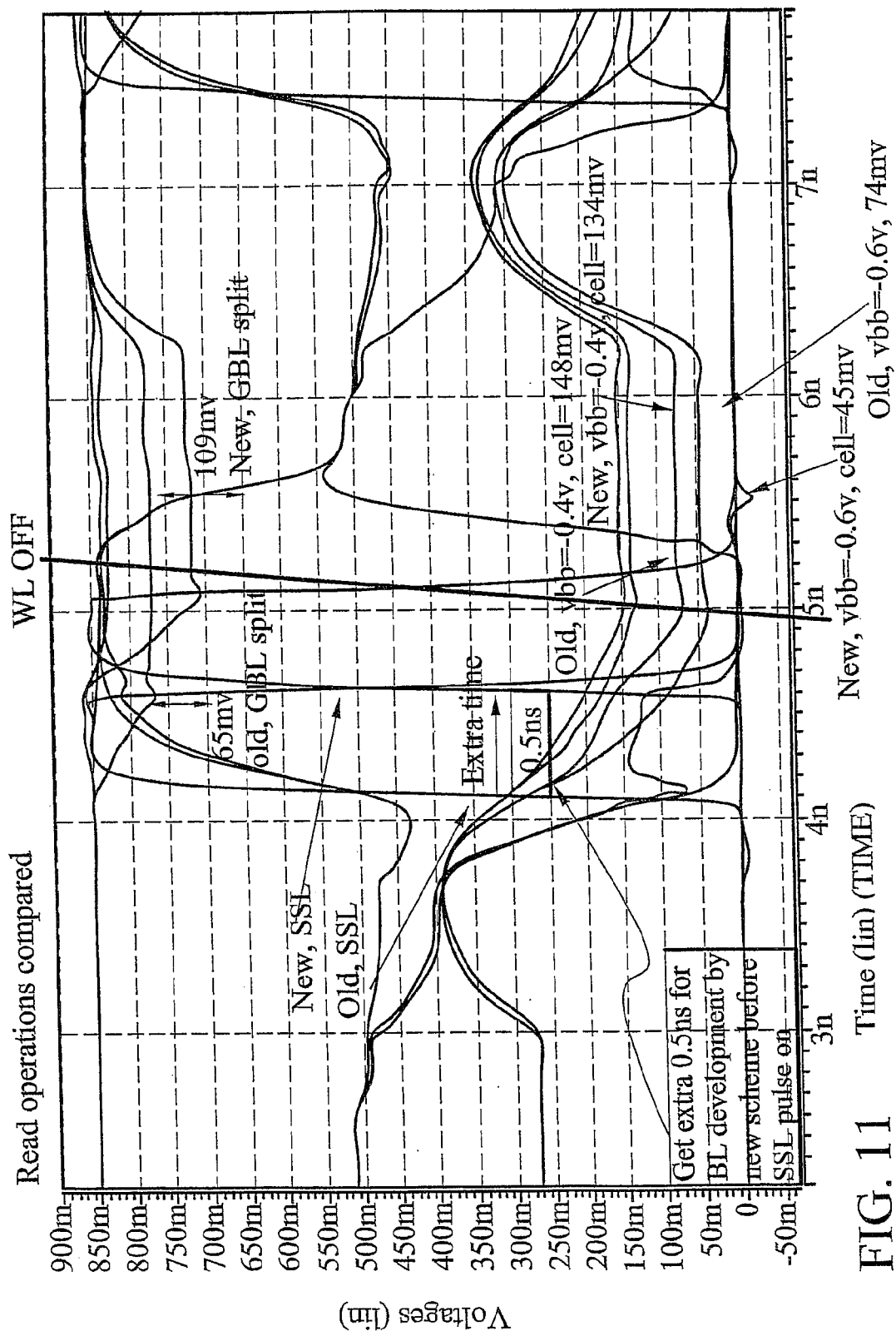
FIG. 11 depicts a timing diagram illustrating a comparison between the read operation in a prior art DRAM and a read cycle in a DRAM incorporating the preferred embodiment of the present invention.

FIG. 11 illustrates, in an exemplary timing diagram, a comparison of the read operations of the preferred embodiment of FIG. 7 and the preferred methods of the invention, and read cycles for select circuitry and read operations of the prior art, to further illustrate some of the advantages of the invention. In FIG. 11, a read cycle begins with a falling word line (not shown in the Figure, but occurring at the left axis). As before, the local bit lines begin spreading apart. The sense amplifier is enabled as can be seen when the local bit lines begin rapidly spreading apart. The first rising edge labeled "Old, SSL" depicts the operation of the prior art select control line SSL in FIG. 5, for example. The second rising edge, which is labeled "New, SSL" depicts the operation of the RSSL line as depicted in the preferred embodiment of FIG. 7, for example. As can be seen, the read select line of the preferred embodiment rises much later in the cycle, 0.5 nanoseconds later in this exemplary 3.3 nanosecond read cycle, and this is shown by the arrow labeled "Extra time" in the figure. This delayed time allows the local bit lines to fully transition to a logical high and low value before the global bit lines are coupled to the local bit lines. Further, the discharge transistors coupled to the global bit lines in the preferred embodiment as shown in FIG. 7 discharge the low going global bit line to ground, and the sense amplifier is not required to discharge the global bit line. In combination these new features eliminate the "read disturb" which can be seen in the prior art local bit line as a "hump" in the falling line at approximately time 4.2 n in the figure. Further, the cell discharge voltage for the new arrangement can be seen to be 45 millivolts at the end of the cycle, much lower than the 74 millivolts for the old approach, and that lower voltage will ensure a satisfactory "0" level is stored in the storage cell at the write back that occurs when the word line turns "off" as indicated in the figure. The voltages on the global bit lines that are output during the read cycle are also improved, as can be seen by comparing the voltages labeled "global bit line split" in FIG. 11, for the prior art, the portion labeled "old, GBL split" shows a differential voltage of only 65 millivolts, while for the preferred embodiment illustrated in FIG. 7, the differential voltage labeled "New, GBL split" is 109 millivolts, the bigger the differential voltage obtained is, the better the noise immunity and performance of the DRAM device.

One skilled in the art will recognize that the advantages obtained by the use of the independent write select and read select circuitry for the bit line select circuit of FIG. 7 are significant, however it is also true that the layout for a DRAM using the preferred embodiment does require extra routing and control to provide the independent write select control lines routed across the DRAM array. This extra area is not significant but must be accounted for in the layout of the array.

The invention thus provides an improved bit line select circuit and methods which overcome the speed limitations and the "read disturb" problems for DRAM arrays of the prior art, while improving the performance of the DRAM array. The preferred embodiments include DRAMs implemented as embedded DRAMs or stand alone DRAM integrated circuits.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A DRAM circuit, comprising:
    a plurality of memory cells arranged in arrays and coupled to word lines and to local bit lines, each memory cell comprising a storage capacitor, each memory cell coupled to one word line and one local bit line of a pair of the local bit lines, the local bit lines being arranged in pairs of local bit lines and complementary local bit lines;
    sense amplifiers each having a pair of differential sense nodes, each sense amplifier physically connected to a pair of the local bit lines with a first sense node coupled to a bit line and a second sense node coupled to the respective complementary local bit line, for sensing a differential voltage placed on the local bit lines by a memory cell and for amplifying the differential voltage to a larger differential voltage;
    equalizer circuits coupled to each pair of local bit lines and operable to couple a predetermined voltage onto the bit lines and to couple the bit lines together responsive to a control signal;
    read select circuits coupled to each pair of local bit lines and each operable to couple the respective local bit line and the respective complementary local bit line to a global bit line and a complementary global bit line, responsive to a read select signal; and
    write select circuits physically connecting each pair of local bit lines to the global bit line and to the complementary global bit line responsive to a write select signal.

2. The DRAM circuit of claim 1 wherein the word lines are arranged along rows of the memory cells, and the local bit lines are arranged along columns of the memory cells, and a memory cell is positioned at the intersections of the word lines and the local bit lines and at the intersections of the word lines and the complementary local bit lines.

3. The DRAM circuit of claim 1 wherein the read select circuits further comprise a first pair of discharge circuits coupled between the global bit line and a ground potential, and a second pair of discharge circuits coupled between the complementary global bit line and a ground potential, and responsive to the read select control signal and the voltage on a local bit line, the discharge circuits couple the respective global bit line and complementary global bit line to the ground potential.

4. The DRAM circuit of claim 3 wherein the first pair and the second pair of discharge circuits further comprise a pair of cascode coupled MOS transistors, the first transistor having a gate coupled to the read select control signal, and the second transistor having a gate coupled to one of the local bit lines, and the pair of cascode coupled MOS transistors form a path from the respective global bit line and the respective complementary global bit line to ground in response to the read select control signal.

5. The DRAM circuit of claim 4 wherein the discharge circuit coupled to the global bit line has a MOS transistor with its gate coupled to the complementary local bit line, and the discharge circuit coupled to complementary global bit line has a MOS transistor with its gate coupled to the local bit line.

6. The DRAM circuit of claim 1 wherein the write select circuits each comprise a first pass gate transistor coupled between the local bit line and the global bit line and a second pass gate transistor coupled between the complementary local bit line and the complementary global bit line, and the write select circuit is operable to provide an electrical connection between the global bit line and the complementary global bit line to the local bit line and the complementary local bit line in response to the write select signal.

7. The DRAM circuit of claim 6 wherein the first and second pass gate transistors each comprise MOS transistors with a control gate coupled to the write select signal.

8. The DRAM circuit of claim 1, and further comprising control circuitry for providing the read select control signal during a read cycle following a first predetermined delay after the sense amplifiers are enabled, and control circuitry for providing the write select control signal during a write cycle following a second predetermined delay after the sense amplifiers are enabled, wherein the second predetermined delay is less than the first.

9. The DRAM circuit of claim 1 wherein the time between a sense amplifier enable and the read select signal for a read cycle is greater than twice the time between a sense amplifier enable and the write select signal for a write cycle.

10. An integrated circuit including an embedded DRAM array, comprising:
   input/output circuitry for receiving and transmitting signals including data signals;
   logic circuitry for performing user defined functions coupled to the data signals;
   an embedded DRAM circuit, comprising:
      global bit lines formed in pairs of a global bit line and a complementary global bit line coupled to receive input/output data;
      a plurality of memory cells in a plurality of arrays arranged in rows and columns;
      a plurality of word lines coupled to the memory cells arranged across the columns to form rows of word lines;
      a plurality of bit lines arranged in pairs of local bit lines and complementary local bit lines physically connected to the memory cells arranged across the rows of memory cells to form columns;
      at least one pair of the local bit lines physically connected to a sense amplifier for each of the columns;
      bit line select circuits for each column coupled to the global bit lines to provide data into the memory cells by writing data onto the local bit lines and sense amplifiers and to receive data from the memory cells and sense amplifiers by reading data onto the local bit lines and outputting the read data to the global bit lines; and
      control circuitry for providing a read select control signal and a write select control signal to each bit line select circuit;
      each bit line select circuit further comprising a read select circuit for discharging the global bit line and the complementary global bit line through a pair of discharge circuits to a ground potential responsive to the read select control signal, and a write select circuit for connecting the global bit line and the complementary global bit line to the local bit line and the complementary local bit line responsive to the write select control signal.

11. The integrated circuit of claim 10 wherein a memory cell is positioned at the intersections of the word lines and the local bit lines and at the intersections of the word lines and the complementary local bit lines.

12. The integrated circuit of claim 10 wherein the read select circuits further comprise a first pair of discharge circuits coupled between the global bit line and a ground potential, and a second pair of discharge circuits coupled between the complementary global bit line and a ground potential, and responsive to the read select control signal and the voltage on a local bit line, the discharge circuits couple the respective global bit line and complementary global bit line to the ground potential.

13. The integrated circuit of claim 12 wherein the first pair and the second pair of discharge circuits further comprise a pair of cascode coupled MOS transistors, the first transistor having a gate coupled to the read select control signal, and the second transistor having a gate coupled to one of the local bit lines, and the pair of cascode coupled MOS transistors form a path from the respective global bit line and the respective complementary global bit line to ground in response to the read select control signal.

14. The integrated circuit of claim 13 wherein the discharge circuit coupled to the global bit line has a MOS transistor with its gate coupled to the complementary local bit line, and the discharge circuit coupled to complementary global bit line has a MOS transistor with its gate coupled to the local bit line.

15. The integrated circuit of claim 14 wherein the write select circuits each comprise a first pass gate transistor physically connected to the local bit line and the local bit line and a second pass gate transistor physically connected to the complementary local bit line and the complementary global bit line, and is operable to provide an electrical connection between the global bit line and the local bit line and to provide an electrical connection between the complementary global bit line and the complementary local bit line in response to the write select signal.

16. The integrated circuit of claim 15 wherein the first and second pass gate transistors each comprise MOS transistors with a control gate coupled to the write select signal.

17. The integrated circuit of claim 16, and further comprising control circuitry for providing the read select control signal during a read cycle following a first predetermined delay after the sense amplifiers are enabled, and control circuitry for providing the write select control signal during a write cycle following a second predetermined delay after the sense amplifiers are enabled, wherein the second predetermined delay is less than the first.

18. The integrated circuit of claim 10 wherein the time between a sense amplifier enable and the read select signal for a read cycle in the embedded DRAM is greater than twice the time between a sense amplifier enable and the write select signal for a write cycle in the embedded DRAM.

19. A method for reading and writing memory cells, comprising:
   providing an array of memory cells each comprising a storage capacitor and an access transistor, arranged in rows and columns, each memory cell access transistor having a control gate coupled to word line, each memory cell having a data line coupled to a data line, the storage capacitor being coupled between the data line and a reference potential for storing data as a charge and for reading data as a discharge of the capacitor;
   arranging the bit lines coupled to the memory cells as pairs of local bit lines and complementary local bit lines, the pairs of local bit lines and complementary local bit lines forming columns of bit lines and the word lines forming rows of word lines, a memory cell being positioned at the intersection of each local bit line and each complementary local bit line with the word lines;
   providing for each bit line pair of a local bit line and a complementary local bit line a sense amplifier for sensing a small voltage placed on one of the local bit line and the complementary local bit line in response to one of the word lines becoming active, and for amplifying the sensed small voltage to a logical voltage and a complementary logical voltage; and providing for each bit line pair a bit line select circuit directly connected to the local bit line and the complementary local bit line for connecting the local bit line pair to a pair of global bit lines, the global bit lines being arranged in pairs of a global bit line and a complementary global bit line;

providing a read select signal for operating the bit line select circuits during a read cycle, and providing a write select control signal for operating the bit line select circuit during a write cycle;

wherein the bit line select circuit discharges one of the global bit lines through a discharge circuit to a ground potential in response to the read select control signal, and electrically connects the global bit line to a local bit line in response to the write select control signal, so as to output data sensed from the memory cells and amplified onto the local bit line and the complementary local bit line onto the global bit line and the complementary global bit line during a read cycle, and so as to input data from the global bit line and the complementary global bit line directly onto the local bit line and the complementary local bit line for storing in the memory cells during a write cycle.

20. The method of claim 19, wherein the step of providing the read select control signal comprises providing the read select control signal after a first predetermined delay following enabling the sense amplifiers for a read cycle, and the step of providing the write select control signal comprises providing the write select control signal after a second predetermined delay following enabling the sense amplifiers for a write cycle, and the first delay is greater than the second delay.

21. The method of claim 19, wherein the read select control signal is provided during a read cycle after a predetermined delay following enabling the sense amplifiers, and the write select control signal is provided in a write cycle simultaneously to enabling the sense amplifiers.

* * * * *